United States Patent
Rao et al.

(10) Patent No.: US 7,265,059 B2
(45) Date of Patent: Sep. 4, 2007

(54) MULTIPLE FIN FORMATION

(75) Inventors: Rajesh A. Rao, Austin, TX (US); Leo Mathew, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/240,243

(22) Filed: Sep. 30, 2005

(65) Prior Publication Data

US 2007/0077743 A1    Apr. 5, 2007

(51) Int. Cl.
*H01L 21/302*    (2006.01)
(52) U.S. Cl. .................. 438/734; 438/164; 438/197; 257/E29.028; 257/E21.236; 257/E21.377
(58) Field of Classification Search ............. 438/717, 438/736, 737, 595, 696, 164, 197, 300, 734, 438/947; 257/E29.028, E21.236, E21.377
See application file for complete search history.

(56) References Cited

U.S. PATENT DOCUMENTS

| 5,543,643 | A | 8/1996 | Kapoor |
| 5,663,586 | A | 9/1997 | Lin |
| 6,525,403 | B2 * | 2/2003 | Inaba et al. .................. 257/618 |
| 6,709,982 | B1 | 3/2004 | Buynoski et al. |
| 6,872,647 | B1 * | 3/2005 | Yu et al. ..................... 438/585 |
| 2005/0020020 | A1 | 1/2005 | Collaert et al. |

OTHER PUBLICATIONS

Choi et al, "Spacer FinFET: Nano-scale CMOS Technology for the Terabit Era", pp. 543-546.
Choi et al, "Nanoscale CMOS Spacer FinFET for the Terabit Era", IEEE Electron Device Letters, vol. 23, pp. 25-27.

* cited by examiner

*Primary Examiner*—George R. Fourson
*Assistant Examiner*—Julio J. Maldonado
(74) *Attorney, Agent, or Firm*—David G. Dolezal; James L. Clingan, Jr.

(57) ABSTRACT

A FinFET includes a plurality of semiconductor fins. Over a semiconductor layer, patterned features (e.g. of minimum photolithographic size and spacing) are formed. In one example of fin formation, a first set of sidewall spacers are formed adjacent to the sides of these patterned features. A second set of sidewall spacers of a different material are formed adjacent to the sides of the first set of sidewall spacers. The first set of sidewall spacers are removed leaving the second set of sidewall spacers spaced from the patterned features. Both the second set of sidewall spacers and the patterned features are used as a mask to an etch that leaves semiconductor fins patterned as per the second set of sidewall spacers and the patterned features. These resulting semiconductor fins, which have sub-lithographic spacings, are then used for channels of a FinFET transistor.

17 Claims, 12 Drawing Sheets

MULTIPLE FIN FORMATION

BACKGROUND OF THE INVENTION

1. Field of the Invention

This invention relates in general to semiconductor devices and more specifically to FinFET devices.

2. Description of the Related Art

FinFETs maybe utilized to implement transistors and other devices in an integrated circuit. Typically, a FinFET includes a channel region implemented in a semiconductor "fin" structure, wherein the channel region includes a portion located along a sidewall of the fin structure. The channel region has a carrier (e.g. electrons for N-channel devices and holes for P-channels devices) transport in a general horizontal direction in the fin. In some examples, FinFETs may have gate structures located adjacent to the fin structures.

Some FinFET devices include multiple fin structures to improve drive current of the FinFET device. However, with some embodiments, the number of fins in a multiple FinFET device is limited by photolithography constraints. With other embodiments, spacers have been used to define the fins. However, the region in between the spacers is not utilized to form fins, thereby limiting the number of fins to two times the number of photo-lithographically defined structures.

What is need is an improved process for making fins of a FinFET device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The features shown in the Figures are not necessarily drawn to scale.

DETAILED DESCRIPTION

The following sets forth a detailed description of a mode for carrying out the invention. The description is intended to be illustrative of the invention and should not be taken to be limiting.

FIGS. 1-12 set forth partial side and top views of a wafer during various stages in its manufacture in the formation of a FinFET having multiple fins defined by both patterned structures and sidewall spacers.

Figure 1:
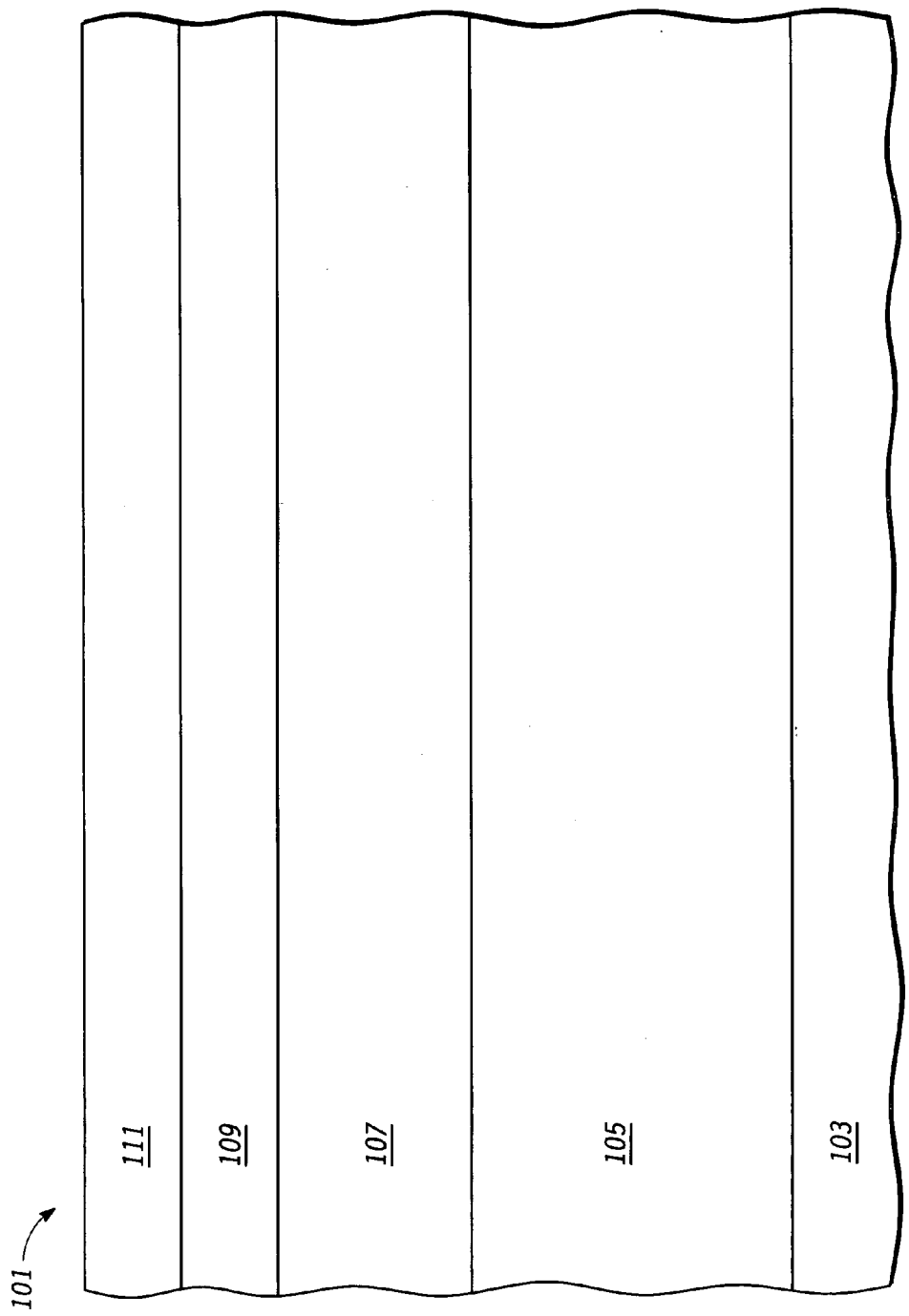
FIG. 1 is a partial side view of a wafer during one stage of its manufacture according to one embodiment of the present invention.

FIG. 1 is a partial side view of wafer 101. Wafer 101 includes a bulk silicon substrate 103 having a dielectric layer 105 (e.g. $SiO_2$) located on substrate 103. A layer 107 of semiconductor material (e.g. monocrystalline silicon, silicon germanium, or germanium) is located on dielectric layer 105. As shown in later stages, semiconductor fins will be formed from layer 107.

In the embodiment shown, a layer 109 is formed on layer 107. In one embodiment, layer 109 is made of e.g. nitride, silicon oxide, a stacked layer (e.g. oxide-nitride-oxide or oxide-poly silicon-oxide). Layer 109 serves as a protective layer for layer 107 for subsequent formation and etching of masked structures located there over.

Layer 111 is located on layer 109. Layer 111 is utilized to form patterned structures for defining fins and current electrode regions (e.g. source/drain regions) in subsequent processes. In one embodiment, layer 111 is made of silicon germanium, but may be made of other materials such as polysilicon or dielectric materials. In the embodiment shown, the material of layer 111 is etch selective with respect to the material of layer 109 and/or with subsequent material formed over 109.

Figure 2:
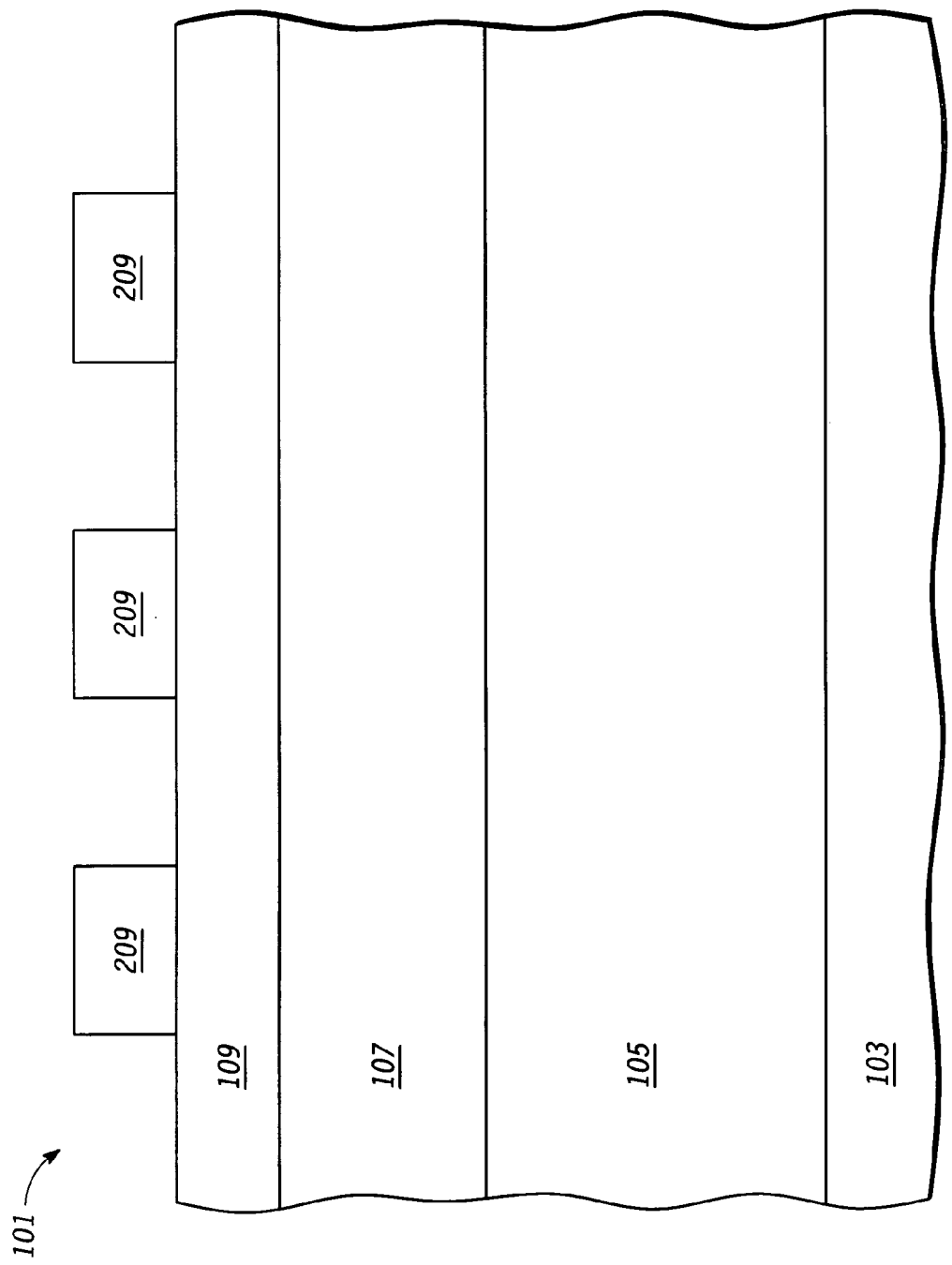
FIG. 2 is a partial side view of a wafer during another stage of its manufacture according to one embodiment of the present invention.

FIG. 2 is a partial side view of wafer 101 after layer 111 has been patterned to form patterned structures 209. During such patterning, mask structures (not shown) are also formed for patterning the current electrode regions. In one embodiment, structures 209 are of the minimum photolithographic feature size (e.g. 30 nm) but maybe of other sizes in other embodiments. In one embodiment, structures 209 are patterned by patterning a layer of photo-resist (not shown) followed by etching exposed portions of layer 111, wherein the photo resist is subsequently removed. In one embodiment, structures 209 are interconnected by current electrode mask portions (not shown in FIG. 3) made from layer 111.

Figure 3:
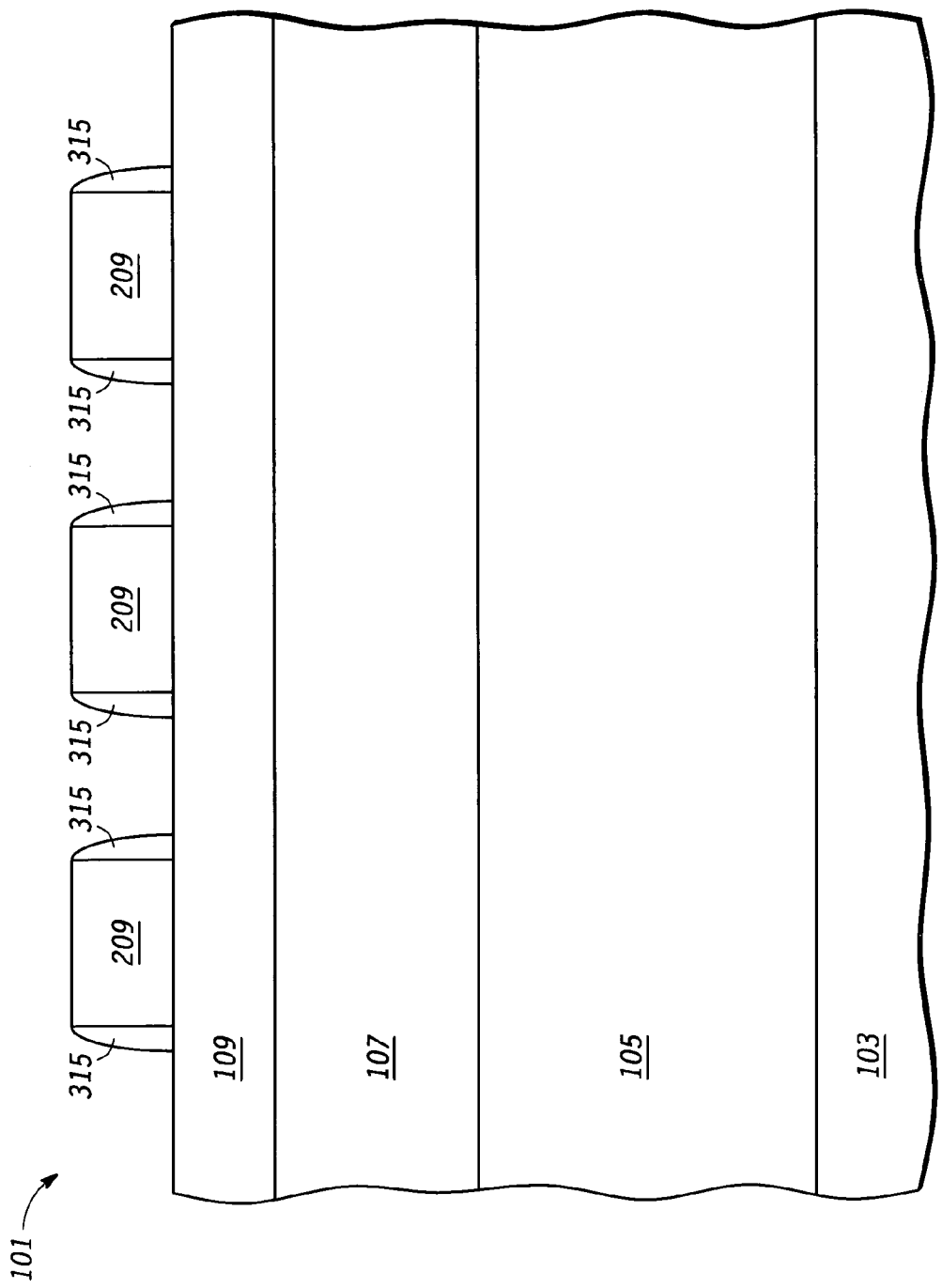
FIG. 3 is a partial side view of a wafer during another stage of its manufacture according to one embodiment of the present invention.

FIG. 3 shows a partial side view of wafer 101 after the formation of sacrificial sidewall spacers 315 on patterned structures 209. In one embodiment, sidewall spacers 315 are made of $SiO_2$, but may be made of other materials in other embodiments. The material of sidewall spacers 315 is etch selective with respect to the material of layer 111 and the material of layer 109.

In one embodiment, sidewall spacers 315 are formed by depositing a layer of spacer material over wafer 101 including over patterned structures 209, wherein the layer of spacer material is an-isotropically etched. However spacers 315 may be formed by other techniques in other embodiments.

Figure 4:
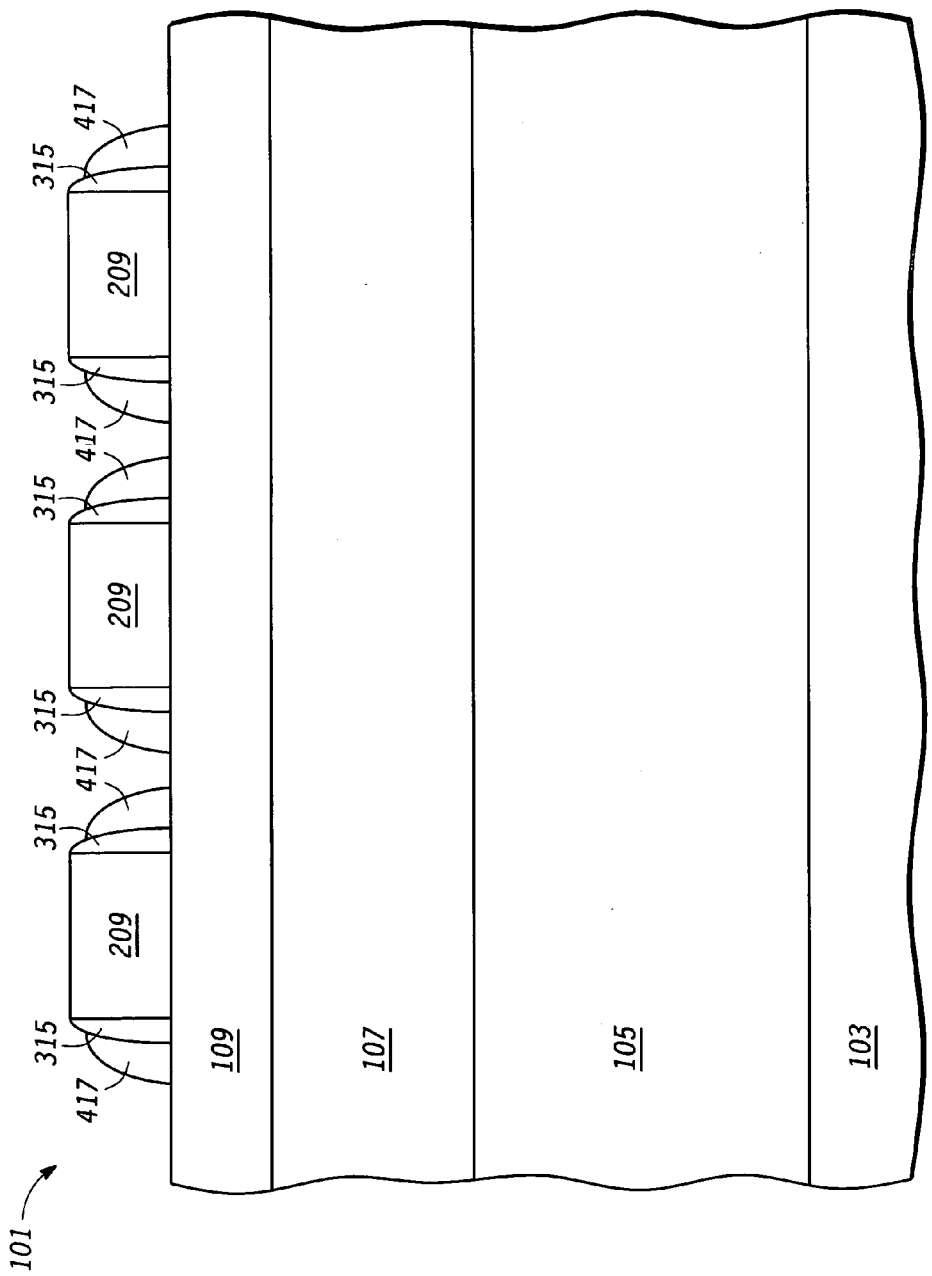
FIG. 4 is a partial side view of a wafer during another stage of its manufacture according to one embodiment of the present invention.

FIG. 4 is a partial side view of wafer 101 after the formation of patterning sidewall spacers 417 adjacent to sidewall spacers 315. In one embodiment, patterning sidewall spacers are made of nitride but may be made of other materials (e.g. dielectrics, semiconductor materials) in other embodiments. The material of spacers 417 is etch selective with the material of layer 109 and the material of spacers 315. In one embodiment, spacers 417 are formed by the techniques set forth above for forming spacers 315, but may be formed by other techniques in other embodiments.

In the embodiment shown, spacers 417 are wider than spacers 315 and narrower than patterned structures 209. However, the relative widths of spacers 417 and the relative width of spacers 315 may be adjusted in order to adjust the widths of subsequently formed fins and the spacings between subsequently formed fins.

Figure 5:
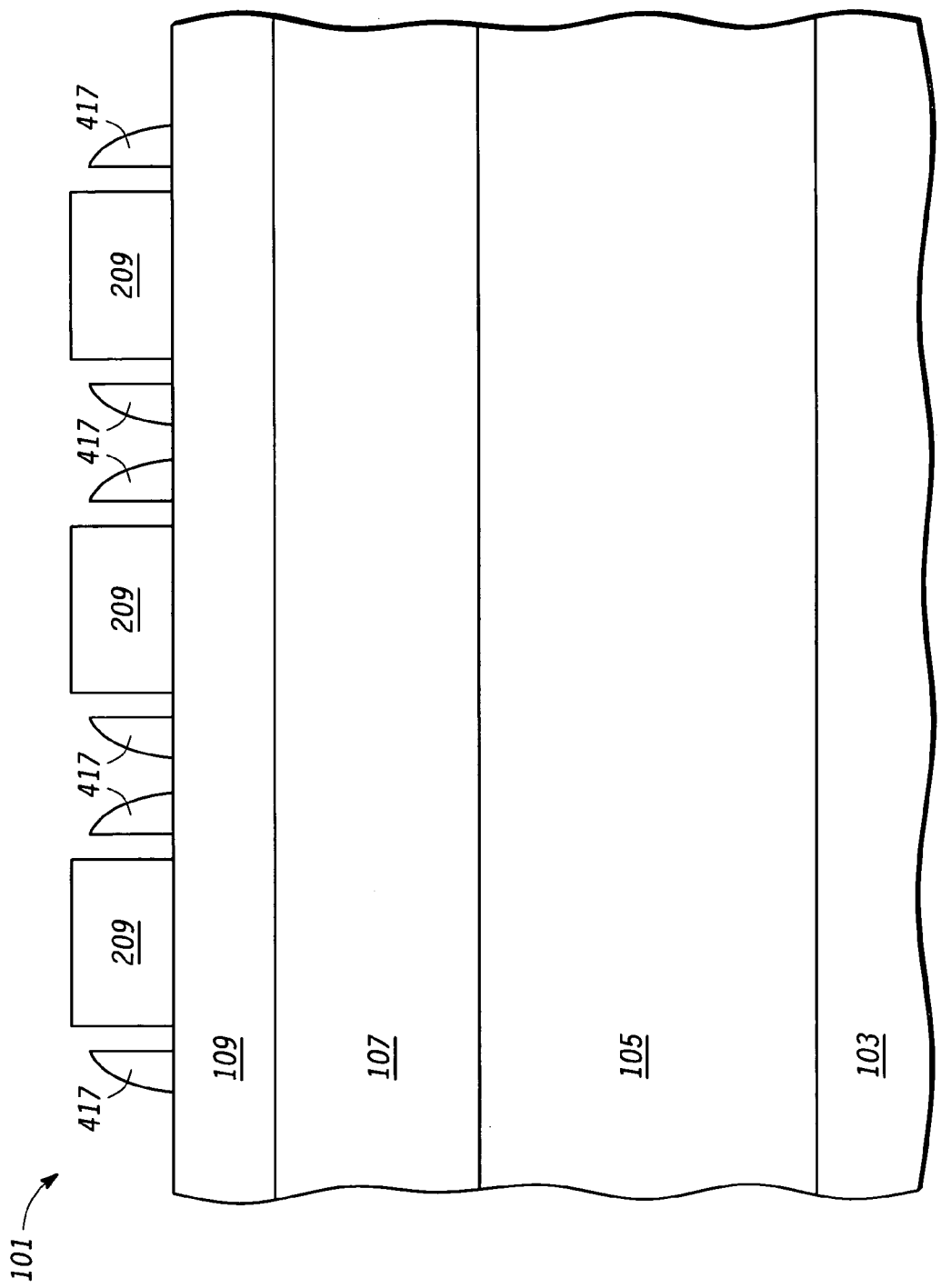
FIG. 5 is a partial side view of a wafer during another stage of its manufacture according to one embodiment of the present invention.

FIG. 5 shows a partial side view of wafer 101 after the removal of sacrificial sidewall spacers 315. In one embodiment, sacrificial sidewall spacers are removed by a wet etch (e.g. diluted HF) that is selective with respect to the material of spacers 417, patterned structures 209, and layer 109. In other embodiments, sidewall spacers 315 may be removed by a dry etch.

Figure 6:
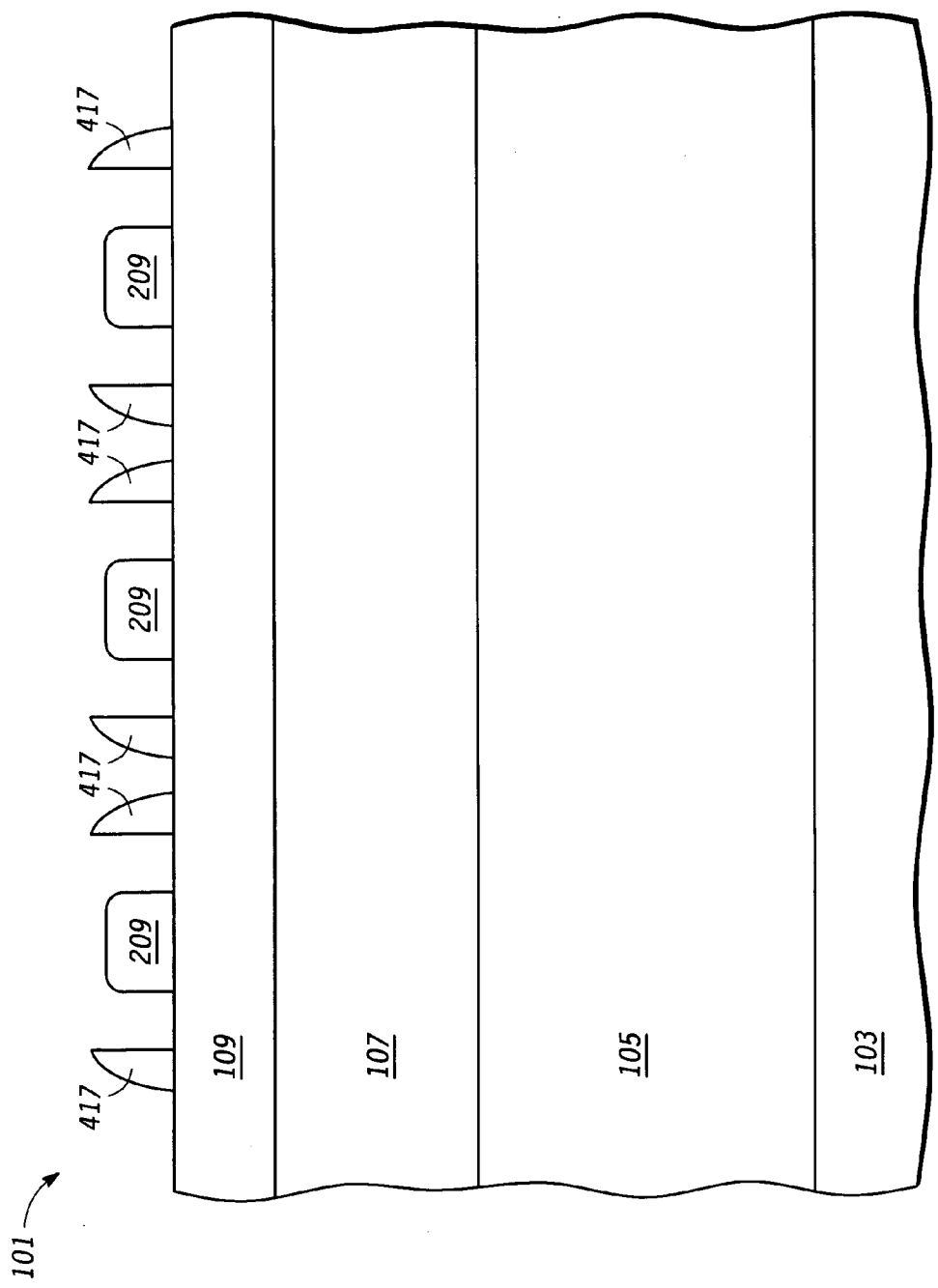
FIG. 6 is a partial side view of a wafer during another stage of its manufacture according to one embodiment of the present invention.

FIG. 6 shows a partial side view of wafer 101 after being subjected to an isotropic wet etch (e.g. ammonium hydroxide and hydrogen peroxide diluted in water) to trim structures 209. In one embodiment, this trimming reduces the width of structures 209 which provides for fins of a reduced width (e.g. of sub-lithographic dimensions) that are patterned from structures 209. The reduction in the widths of such fins may allow such fins to more closely match the width of the fins defined by sidewall spacers 417. In some embodiments, patterned structures 209 are trimmed to widths that are substantially the same as the widths of spacers 417. In some embodiments, isotropic dry etch chemistries can be used to trim structures 209.

Some embodiments may not implement processes that reduce the widths of structures 209 prior to patterning layer 107.

Figure 7:
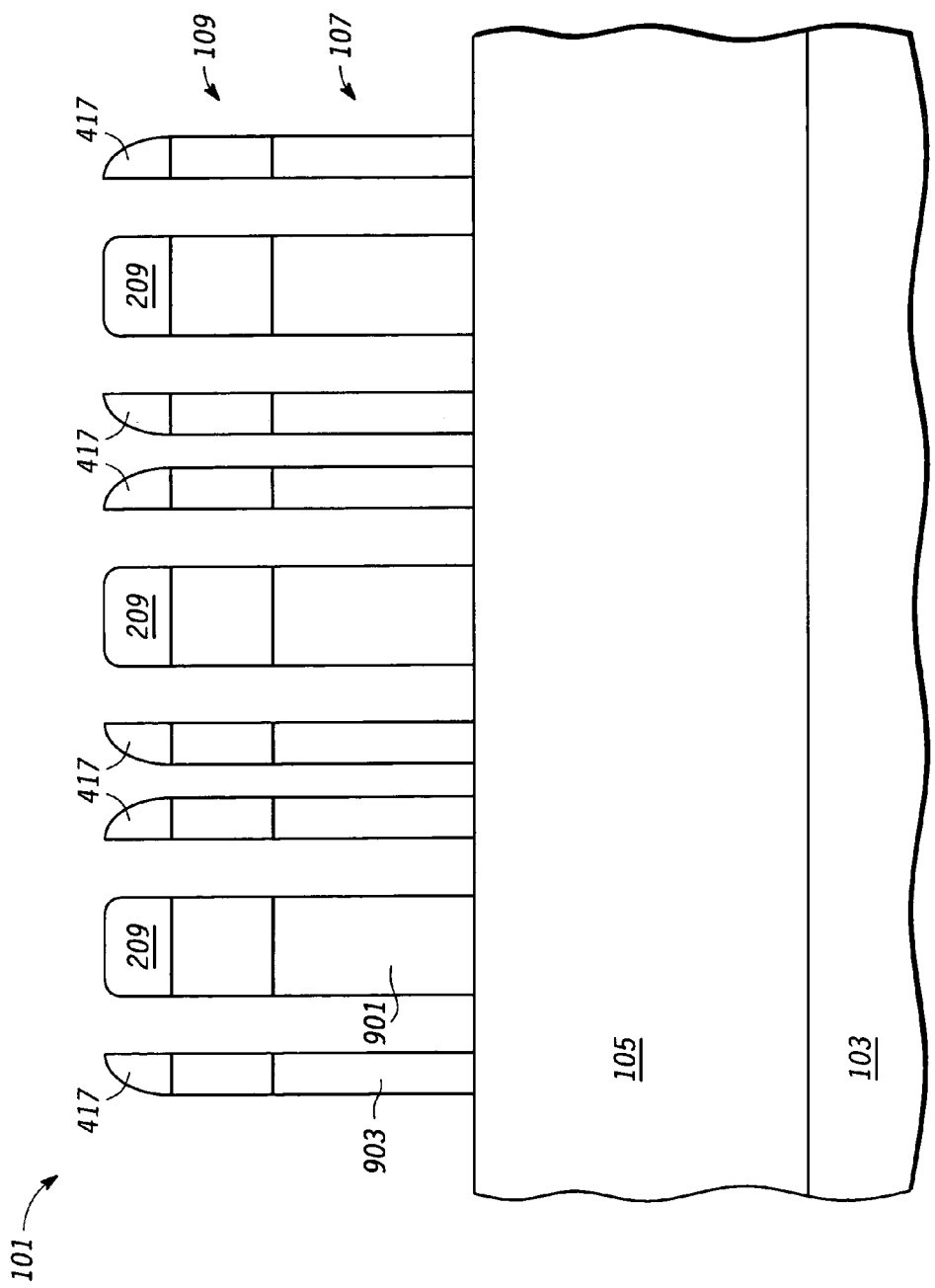
FIG. 7 is a partial side view of a wafer during another stage of its manufacture according to one embodiment of the present invention.

FIG. 7 is a partial side view of wafer 101 after layer 107 has been etched to form fins 901 and 903 using structures 209 and sidewall spacers 417 as hard masks to leave semiconductor fins patterned as per sidewall spacers 417 and patterned structures 209. Fins 901 are defined by structures 209 and fins 903 are defined by sidewall spacers 417.

In one embodiment, layer 107 is etched by first etching layer 109 as per the pattern of structures 209 and sidewall spacers 417. In one embodiment, layer 109 is etched by a reactive ion dry etch, but may be etched by other techniques in other embodiments. Subsequently, layer 107 is then etched by a reactive ion etch with a different etch gas chemistry compared to that used to remove exposed portions of 109. Layer 107 maybe etched by different etchants in other embodiments.

In another embodiment, layer 107 may be etched using structures 209 and sidewall spacers 417 as hard masks to leave semiconductor fins patterned as per the sidewall spacers 417 and the patterned structures 209 by other processes. For example, layer 107 may be etched after the pattern of spacers 417 and structures 209 is transferred to layer 109 and spacers 417 and structures 209 are removed.

In the embodiment shown, the exposed portions of layer 107 are etched all of the way to dielectric layer 105. However, in some embodiments, the exposed portions of layer 107 are only partially etched by e.g. using a timed etch. With these partially etched embodiments, an additional channel region can be formed between the fins. Further, the semiconductor regions between adjacent FinFETs may be implanted to provide for electrical isolation between the FinFETs. These partially timed etch processes may be utilized with implementing a multi-fin structure on bulk silicon.

In some embodiments, layer 109 is optional.

Figure 8:
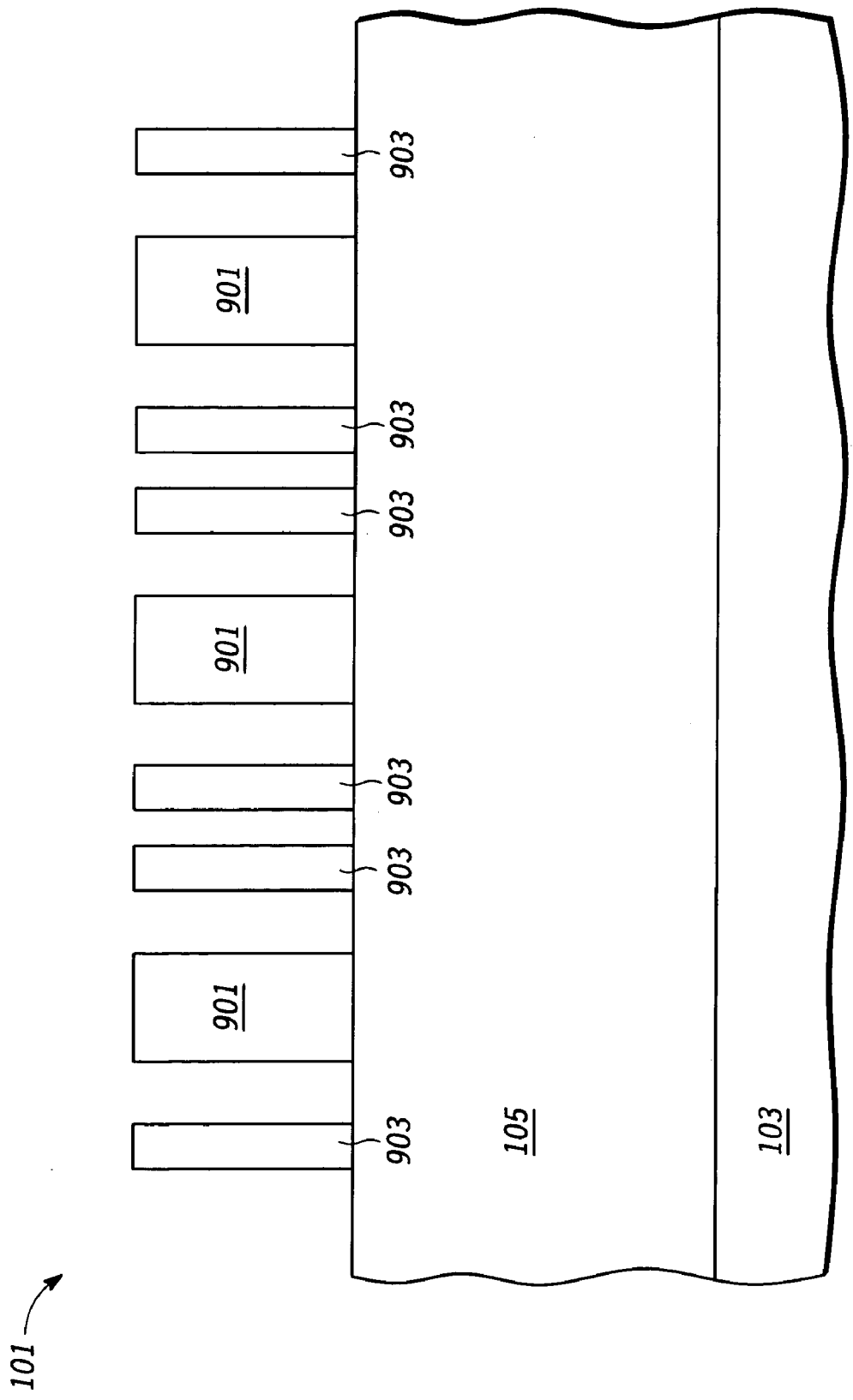
FIG. 8 is a partial side view of a wafer during another stage of its manufacture according to one embodiment of the present invention.

FIG. 8 is a side view of wafer 101 after the remaining portions of layer 109, structures 209, and sidewall spacers 417 have been removed. In one embodiment, these structures are removed by a wet etch (diluted HF) selective to layer 107. In one embodiment, the etching of the remaining portions of layer 109 under cuts structures 209 and spacers 417. In other embodiments, other etch techniques may be used to remove the layers selective to the fins. In some embodiments, spacers 417 and structures 209 may be removed prior to the etch of exposed portions of layer 107. In some embodiments, the material of layer 109 is not removed from the top of the fins prior to the deposition of gate material 913.

Figure 9:
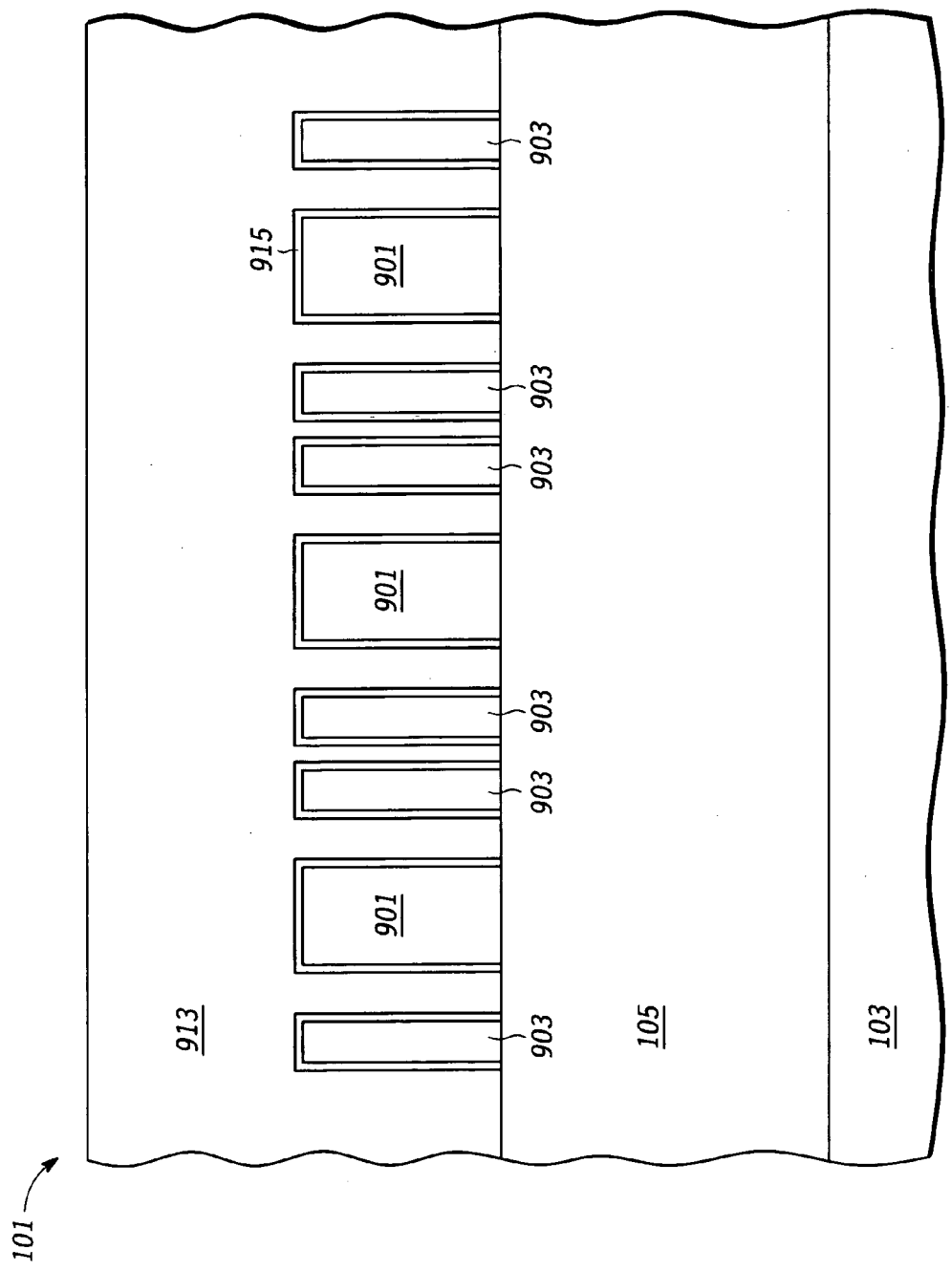
FIG. 9 is a partial side view of a wafer during another stage of its manufacture according to one embodiment of the present invention.

FIG. 9 shows a partial side view of wafer 101 after the formation of a gate dielectric 915 and the formation of gate material 913 over wafer 101. In one embodiment, gate dielectric 915 is formed by thermal oxidation of the fins 901 and 903. However, in other embodiments, the gate dielectric may be a deposited high K material dielectric (e.g. hafnium oxide aluminum oxide, hafnium silicate).

In one embodiment, gate material 913 is deposited polysilicon, doped in situ. In other embodiments, gate material 913 may be made of other materials e.g. metals such as tantalum silicon nitride, titanium nitride or other semiconductor materials e.g. silicon germanium or a combination thereof. In the embodiment shown gate material 913 is planarized, but maybe unplanarized in other embodiments.

As shown in FIG. 9, the number of fins that can be produced from a combination of photo-lithographically defined structure (e.g. 209) and spacer defined structures is increased by the number of such structures over prior methods of forming fins that utilize only sidewall spacers for fin formation. For example, in FIG. 9, nine fins are defined from the formation of three photo-lithographic structures 209 and six sidewall spacers 417. In prior methods, only 6 fins would formed if only sidewall spacers were used, and only three fins are formed if only photo-lithographically defined features are used. As opposed to prior methods, an additional fin 901 is formed between two fins 903 define by sidewall spacers 417. Accordingly, FinFETs formed from wafer 101 may include additional fins produced without additional photolithography defined steps. Such FinFETs may provide for improved drive current due to the additional channels implemented in the additional fins.

Figure 10:
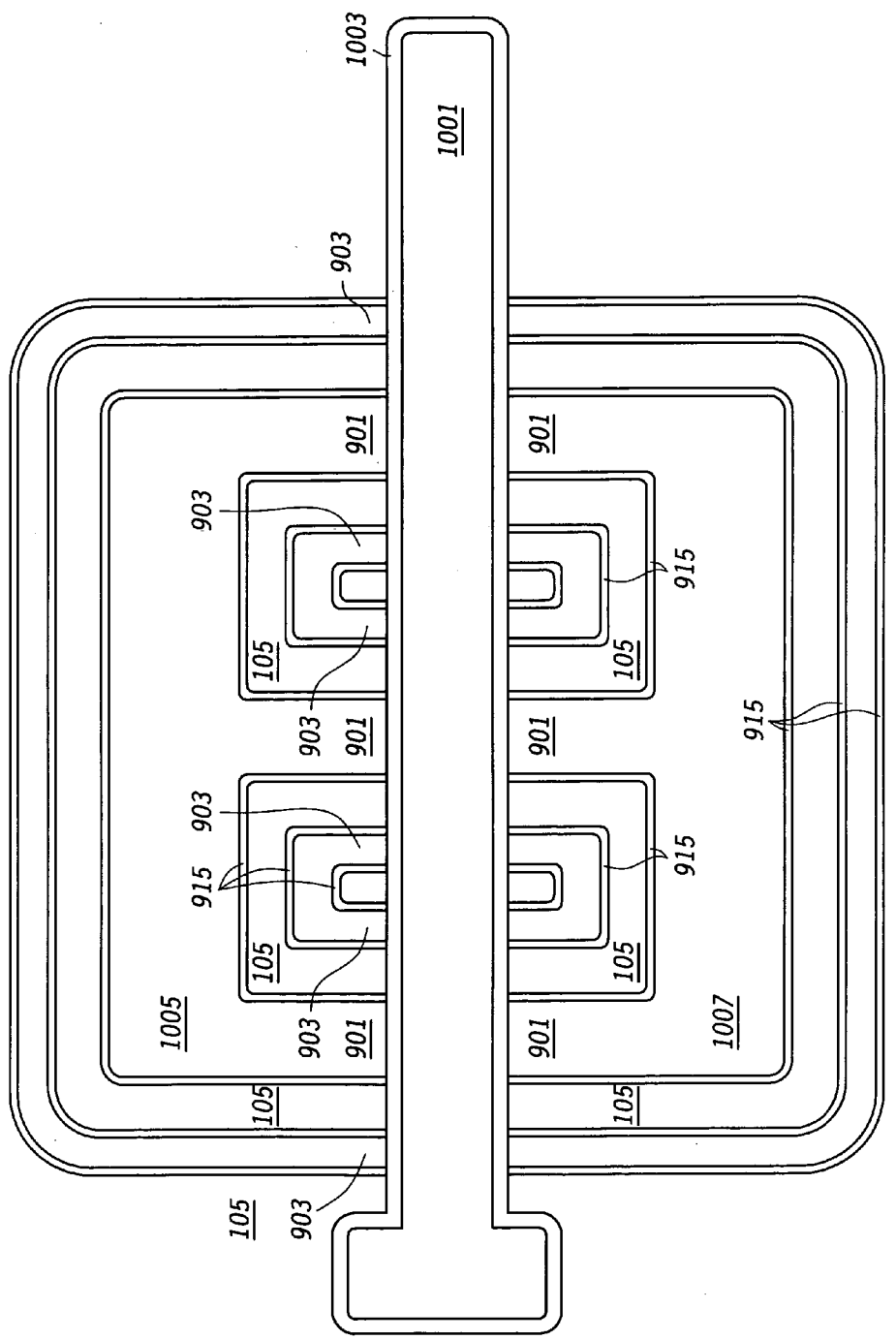
FIG. 10 is a partial top of a wafer during another stage of its manufacture according to one embodiment of the present invention.

FIG. 10 is a partial top view of wafer 101 after gate material 913 has been patterned for form gate 1001. Also, shown in FIG. 10, are source/drain region 1005 and source/drain region 1007. As shown in FIG. 10, source/drain regions 1007 and 1005 are connected via fins 901.

As shown in FIG. 10, fins 903 patterned from the sidewall spacers 417 are isolated from source/drain regions 1005 and 1007 and from fins 901. As shown in FIG. 10, the four interior fins 903 are implemented as two "donut" structures and the two outer fins 903 are implemented as surrounding the source/drain regions 1005 and 1007. As shown on FIG. 10, the gate dielectric is located on the sidewalls of fins 903, the sidewalls of fins 901, and the sidewalls of source/drain regions 1005 and 1007. Although not shown on FIG. 10, gate dielectric 915 is located on the top of fins 903, fins 901, and source/drain regions 1005 and 1007.

Also shown in FIG. 10 is a spacer 1003 formed on the sidewall of gate 1001. In one embodiment, spacer 1003 is formed from silicon oxide or silicon nitride or a combination thereof. In one embodiment, spacer 1003 is formed by depositing a layer of spacer material (not shown) and dry etching (e.g. a plasma etch) the layer of spacer material to substantially leave the spacer material on the sidewall of gate 1001. Because in some embodiments, the height of the gate 1001 is higher than the fins 901 and 903 and source/drain regions 1005 and 1007, this etch removes the spacer material from the sidewall of the fins while still leaving it on portions of the sidewalls of gate 1001. Sidewall spacer 1003 is used to prevent electrical shorting of gate 1001 to the source/drain regions during subsequent epitaxial growth and silicidation processes.

In one embodiment, spacer 1003 is formed by depositing a layer of spacer material over wafer 101 and then patterning the layer of spacer material to leave the spacer material on and adjoining gate 1001 with the rest of the spacer material being removed.

Figure 11:
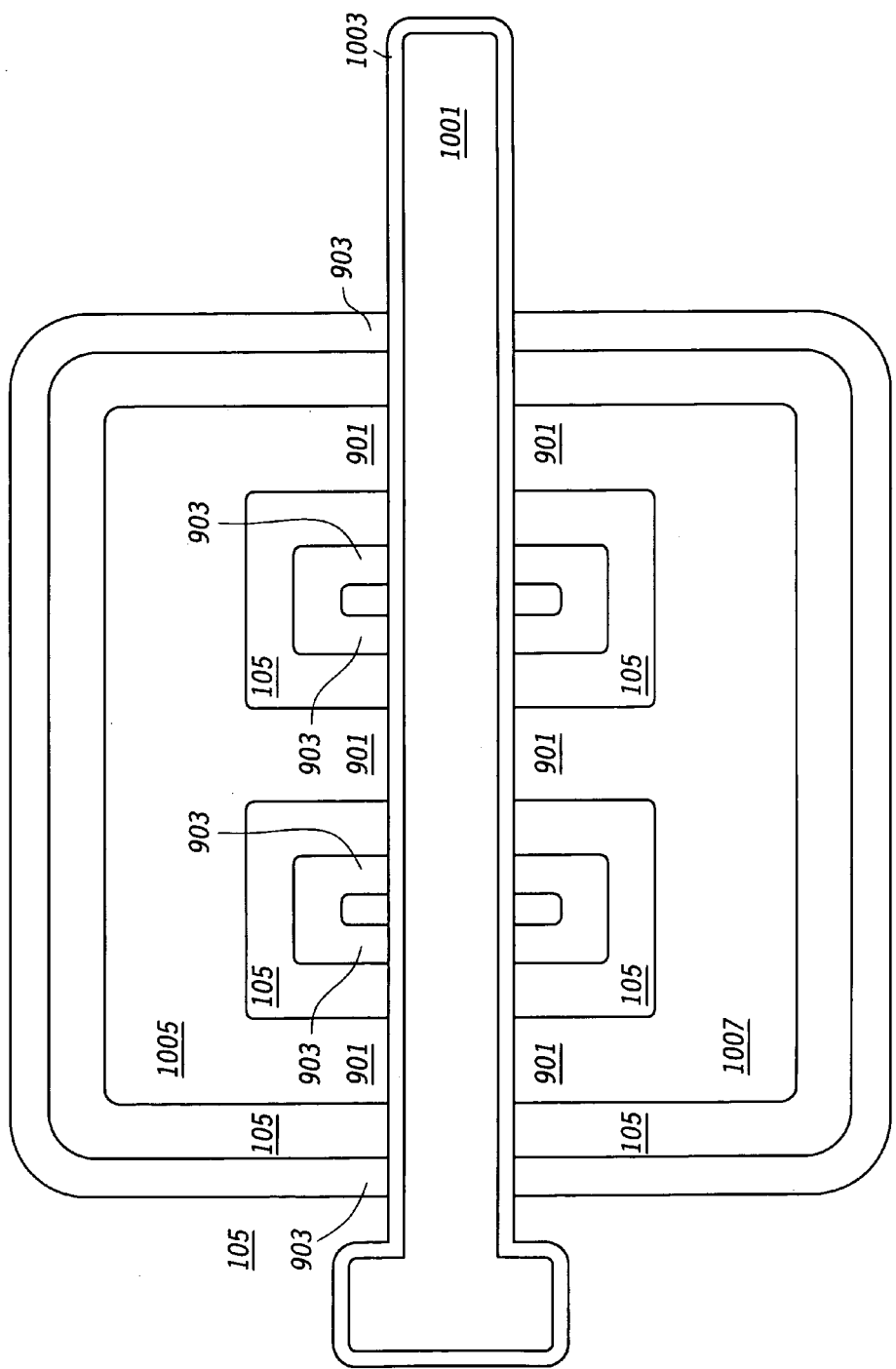
FIG. 11 is a partial top view of a wafer during another stage of its manufacture according to one embodiment of the present invention.

FIG. 11 shows a partial top view of wafer 101 after all exposed gate dielectric 915 has been removed. Removal of the gate dielectric and exposure of the semiconductor material enables epitaxial growth of semiconductor material and silicidation of exposed semiconductor material in subsequent steps.

Figure 12:
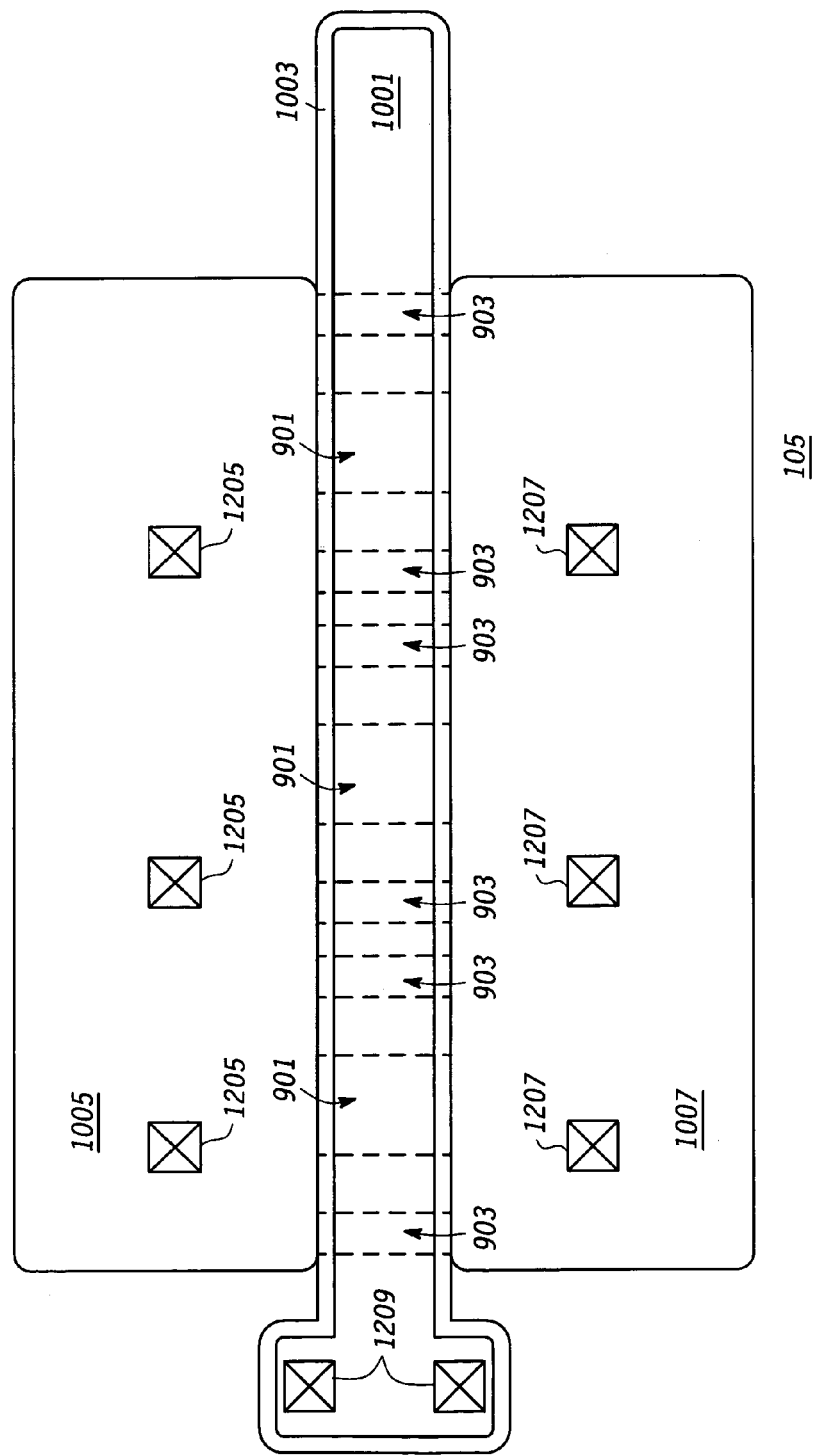
FIG. 12 is a partial top view of a wafer during another stage of its manufacture according to one embodiment of the present invention.

FIG. 12 shows a partial top view of wafer 101 after an epitaxial growth of the exposed semiconductor material using a selective epitaxial process that grows materials such as e.g. silicon, silicon germanium, silicon germanium carbon, on the semiconductor material. As shown in FIG. 12, the epitaxial growth process grows semiconductor material on the exposed surfaces of the source/drain regions 1005 and 1007, fins 901 and fins 903 such that fins 903 are continuous with source/drain regions 1005 and 1007. As shown in FIG. 12, fins 903 and 901 under gate 1001 are still isolated from each other while being continuous outside the gate area due to the epitaxial growth. This epitaxial growth outside gate 1001 may reduce parasitic source/drain series resistance.

After the expitaxial growth, source/drain regions 1005 and 1007 are doped and silicided by conventional processes such as e.g. ion implantation and thermal anneals.

Afterwards gate contacts 1209 and source/drain contacts 1205 and 1207 are formed on the gate 1001 and source/drain regions 1005 and 1007.

Further processing maybe performed on wafer 101 including the formation of interconnect layers over wafer 101 to interconnect other FinFET devices (not shown) as well as other devices of wafer 101. Afterwards bond pads and a passivation layer maybe formed on wafer 101. Wafer 101 may be then singulated to form individual integrated circuits, each including multiple FinFETs as shown in FIG. 12.

In one embodiment, a method for forming a FinFET includes providing a semiconductor layer, forming a first layer of a first material over the semiconductor layer, patterning the first layer to form a patterned feature having a pair of sidewalls, and forming a pair of first sidewall spacers of a second material adjacent to the pair of sidewalls of the patterned feature. The method includes forming a pair of second sidewall spacers of a third material that is a different type from the second material. The pair of second sidewall spacers are adjacent to the pair of first sidewall spacers. The method also includes removing the pair of first sidewall spacers, and after removing the pair of first sidewall spacers, etching the semiconductor layer using the pair of second sidewall spacers and the patterned feature as a mask to leave semiconductor fins patterned as per the pair of second sidewall spacers and the patterned feature. Channels of the FinFET are implemented in the semiconductor fins.

In another embodiment, the a method for forming a FinFET includes providing a semiconductor device structure including a substrate layer and a semiconductor layer over the substrate layer, forming a first layer of a first material over the semiconductor layer, providing a second layer of a second material over the first layer, patterning the second layer to form a patterned feature having a first sidewall and a second sidewall, forming a first sidewall spacer adjacent to the first sidewall and a second sidewall spacer adjacent to the second sidewall, wherein the first and second sidewall spacers are of a third material, and forming a third sidewall spacer adjacent to the first sidewall spacer and a fourth sidewall spacer adjacent to the second sidewall spacer. The third and fourth sidewall spacers are of a fourth material. The method further includes removing the first and second sidewall spacers, trimming the patterned feature using an isotropic etch, etching the semiconductor layer to leave semiconductor fins patterned as per the third and fourth sidewall spacers and the patterned feature, wherein channels of the FinFET are implemented in the semiconductor fins.

In another embodiment, a method for forming a FinFET includes providing a semiconductor layer, forming a first layer of a first material over the semiconductor layer, patterning the first layer to form a first patterned feature having a first sidewall, forming a first sidewall spacer of a second material adjacent to the first sidewall, forming a second sidewall spacer of a third material adjacent to the first sidewall spacer, removing the first sidewall spacer, etching the semiconductor layer using the second sidewall spacer and the patterned feature as a mask to form a first fin as per the first patterned feature and a second fin as per the second sidewall spacer. A first channel of the FinFET is implemented in the first fin and a second channel of the FinFET is implemented in the second fin.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for forming a FinFET, comprising:
   providing a semiconductor layer;
   forming a first layer of a first material over the semiconductor layer;
   patterning the first layer to form a patterned feature having a pair of sidewalls;
   forming a pair of first sidewall spacers of a second material adjacent to the pair of sidewalls of the patterned feature;
   forming a pair of second sidewall spacers of a third material that is a different type from the second material, wherein the pair of second sidewall spacers are adjacent to the pair of first sidewall spacers;
   removing the pair of first sidewall spacers;
   after removing the pair of first sidewall spacers, etching the semiconductor layer using the pair of second sidewall spacers and the patterned feature as a mask to leave semiconductor fins patterned as per the pair of second sidewall spacers and the patterned feature;
   trimming the patterned feature prior to the etching the semiconductor layer; and
   wherein channels of the FinFET are implemented in the semiconductor fins.

2. The method of claim 1, wherein the first material and the third material are of different types, and the trimming comprises applying an etchant that is selective between the first material and the third material.

3. The method of claim 2, further comprising
providing a second layer of a fourth material over the semiconductor layer prior to forming the first layer, whereby the forming the first layer over the semiconductor layer results in the first layer being on the second layer; and wherein the etchant that is selective between the first and third materials is further characterized as being selective between the first material and the fourth material.

4. The method of claim 2, wherein the first material comprises silicon germanium, the third material comprises silicon nitride, and the semiconductor layer comprises silicon, and the etchant that is selective between the first material and third material comprises a wet etchant.

5. The method of claim 1 wherein the pair of second sidewall spacers has a first width and the trimming narrows the patterned feature to substantially the first width.

6. The method of claim 1, further comprising:
providing a second layer of a fourth material over the semiconductor layer prior to forming the first layer, whereby the forming the first layer over the semiconductor layer results in the first layer being on the second layer;
etching through the second layer by applying an etchant that is selective between the first material and the fourth material.

7. The method of claim 6 wherein the etchant that is selective between the first material and the fourth material is further characterized as being selective between the third material and the fourth material.

8. The method of claim 1, further comprising:
forming a gate dielectric on the semiconductor fins; and
forming a continuous gate electrode on the gate dielectric.

9. The method of claim 8, wherein:
a first end of a semiconductor fin of the semiconductor fins that is formed as per the patterned feature is continuous with a first elevated source/drain region; and
a second end of the semiconductor fin that is formed as per the patterned feature is continuous with a second elevated source/drain region;
the method further comprising:
epitaxially growing a semiconductor material between the first elevated source/drain region and first ends of semiconductor fins of the semiconductor fins that are formed as per the pair of second sidewall spacers; and
epitaxially growing the semiconductor material between the second elevated source/drain region and second ends of the semiconductor fins that are formed as per the pair of second sidewall spacers.

10. A method for forming a FinFET, comprising:
providing a semiconductor device structure including a substrate layer and a semiconductor layer over the substrate layer;
forming a first layer of a first material over the semiconductor layer;
providing a second layer of a second material over the first layer;
patterning the second layer to form a patterned feature having a first sidewall and a second sidewall;
forming a first sidewall spacer adjacent to the first sidewall and a second sidewall spacer adjacent to the second sidewall, wherein the first and second sidewall spacers are of a third material;
forming a third sidewall spacer adjacent to the first sidewall spacer and a fourth sidewall spacer adjacent to the second sidewall spacer, wherein the third and fourth sidewall spacers are of a fourth material;
removing the first and second sidewall spacers;
trimming the patterned feature using an isotropic etch;
etching the semiconductor layer to leave semiconductor fins patterned as per the third and fourth sidewall spacers and the patterned feature;
wherein channels of the FinFET are implemented in the semiconductor fins.

11. The method of claim 10, wherein the trimming comprises applying a wet etchant.

12. The method of claim 10, wherein the second material comprises silicon germanium, the fourth material comprises nitride, and the wet etchant comprises hydrofluoric acid and ammonium hydroxide.

13. The method of claim 10, wherein the first material comprises oxide.

14. The method of claim 10 wherein the second material comprises silicon germanium, the first material comprises oxide, the fourth material comprises nitride, and the semiconductor layer comprises monocrystalline silicon.

15. The method of claim 10, wherein:
the patterning the second layer is further characterized as forming a plurality of additional patterned features;
the forming the first and second sidewall spacers is further characterized as forming a plurality of additional first and second sidewall spacers adjacent to the plurality of additional patterned features;
the forming the third and fourth sidewall spacers is further characterized as forming a plurality of additional third and fourth sidewall spacers adjacent to the plurality of additional first and second sidewall spacers;
the removing the first and second sidewall spacers is further characterized as removing the plurality of additional first and second sidewall spacers;
the trimming the patterned feature is further characterized as trimming the plurality of additional patterned features;
the etching is further characterized as leaving additional fins patterned as per the plurality of additional patterned features and the plurality of additional third and fourth sidewall spacers; and
wherein additional channels of the FinFET are implemented in the additional fins.

16. The method of claim 10, wherein the trimming the patterned feature narrows the patterned feature to a width that is substantially the same as a width of the third sidewall spacer.

17. A method for forming a FinFET, comprising:
providing a semiconductor layer:
forming a first layer of a first material over the semiconductor layer;
patterning the first layer to form a patterned feature having a first sidewall;
forming a first sidewall spacer of a second material adjacent to the first sidewall;
forming a second sidewall spacer of a third material adjacent to the first sidewall spacer;
removing the first sidewall spacer;
etching the semiconductor layer using the second sidewall spacer and the patterned feature as a mask to form a first fin as per the first patterned feature and a second fin as per the second sidewall spacer;

wherein a first channel of the FinFET is implemented in the first fin and a second channel of the FinFET is implemented in the second fin;

forming a second patterned feature simultaneously with forming the first patterned feature;

forming a third sidewall spacer adjacent to the second patterned feature simultaneously with forming the first sidewall spacer;

forming a fourth sidewall spacer adjacent to the third sidewall spacer simultaneously with forming the second sidewall spacer;

removing the third sidewall spacer simultaneously with removing the first sidewall spacer;

forming a third fin as per the second patterned feature and a fourth fin as per the fourth sidewall spacer simultaneously with forming the first and second fins;

wherein a third channel of the FinFET is implemented in the third fin and a fourth channel of the FinFET is implemented in the fourth fin; and comprising trimming the first and second patterned features with an etch prior to etching the semiconductor layer.

* * * * *